US005663965A

United States Patent [19]
Seymour

[11] Patent Number: 5,663,965
[45] Date of Patent: Sep. 2, 1997

[54] APPARATUS AND METHOD FOR TESTING A MEMORY ARRAY

[75] Inventor: Edward Michael Seymour, Round Rock, Tex.

[73] Assignee: International Business Machines Corp., Armonk, N.Y.

[21] Appl. No.: 539,932

[22] Filed: Oct. 6, 1995

[51] Int. Cl.⁶ .................. G01R 31/28; G11C 7/00
[52] U.S. Cl. .................. 371/22.31; 371/22.4; 365/201
[58] Field of Search .................. 371/22.3, 22.4, 371/21.5, 22.2, 37.6, 37.1; 365/201, 189

[56] References Cited

U.S. PATENT DOCUMENTS

| | | | |
|---|---|---|---|
| 4,105,999 | 8/1978 | Nakamura | 340/146.1 |
| 4,608,669 | 8/1986 | Klara et al. | 365/201 |
| 4,686,456 | 8/1987 | Furuyama et al. | 324/73 R |
| 4,852,061 | 7/1989 | Baron et al. | 365/189.02 |
| 4,894,830 | 1/1990 | Kawai | 371/22.3 |
| 4,974,226 | 11/1990 | Fujimori et al. | |
| 5,309,449 | 5/1994 | Gandini et al. | 371/37.1 |
| 5,394,403 | 2/1995 | Klein | 371/21.1 |
| 5,425,035 | 6/1995 | Spence et al. | 371/22.4 |

Primary Examiner—Hoa T. Nguyen
Attorney, Agent, or Firm—Kelly K. Kordzik; Winstead Sechrest & Minick P.C.; Michael A. Davis, Jr.

[57] ABSTRACT

There is disclosed a central controller for simultaneously testing the embedded arrays in a processor. Test data vectors are serially shifted into a latch and stored into each location in the embedded arrays of the processor. The test data are then read out of the embedded arrays into a read latch and serially shifted into a multiple input shift register, where a polynomial division is performed on the test vector data. If all memory locations in the embedded array function properly, a remainder value will result that is equal to a unique signature remainder for the test vectors used.

11 Claims, 6 Drawing Sheets

1

APPARATUS AND METHOD FOR TESTING A MEMORY ARRAY

TECHNICAL FIELD OF THE INVENTION

The present invention relates in general to data processing systems and, in particular, to a simplified method and apparatus for testing embedded arrays in large scale processors.

BACKGROUND OF THE INVENTION

Many large scale processor devices contain complex embedded arrays, such as cache memories and banks of general purpose registers and specialized registers. It is quite common to provide these processors with Array Built In Self Test (ABIST) circuitry to test the functionality of the embedded arrays. The ABIST circuitry is usually activated immediately after power-up and performs a pass/fail test of the storage locations in the array. Prior art processors typically provide separate, localized ABIST controllers and test circuits for each embedded array.

As the size and complexity of processor chips increase, the number and complexity of the embedded arrays increase accordingly. This results in greater use of ABIST circuits on the chips as well. Increasingly, this is becoming a design limitation, due to the size and power constraints of the microprocessor chips. Even if a centralized ABIST controller is used to control multiple ABIST test circuits, each associated with an individual embedded array, a large number of global control wires must be incorporated into the chip design, increasing both complexity and noise.

There is therefore a need for systems and methods of testing distributed, embedded arrays in microprocessors that minimize the amount and the size of the ABIST test circuitry used to test the embedded arrays. There is a still further need for systems and methods of providing centralized control to a number of ABIST test circuits that minimize the number of control lines distributed across the microprocessor chip.

SUMMARY OF THE INVENTION

The limitations inherent in the prior art are overcome by the present invention which provides a central ABIST controller which controls a plurality of ABIST test circuits through a serial communications link. The present invention also simplifies the prior art ABIST test circuits by replacing large test vector data buffers and output comparator circuitry with serial input scan-in/scan-out registers.

In one embodiment of the present invention, there is provided an apparatus for testing an embedded memory array comprising: 1) a test data input latch for receiving a test data vector on a serial input of the test data input latch and writing the test data vector into a first location in the memory array, 2) an address buffer for receiving a test address vector on a serial input of the address buffer and applying the test address vector to the memory array, and 3) an output latch for reading the test data vector from the first location in the memory array. Control logic is provided for scanning the test data vector and the test address vector into the test data input latch and the address buffer, respectively. The control logic also generates a write signal that causes the test data vector to be written from the test data input latch into the first location in the memory array and generates a read signal that causes the test data vector to be read from the first location in the memory array into the output latch.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiments depicted in FIGS. 1–5 of the drawings, in which like numbers designate like parts.

Figure 1:
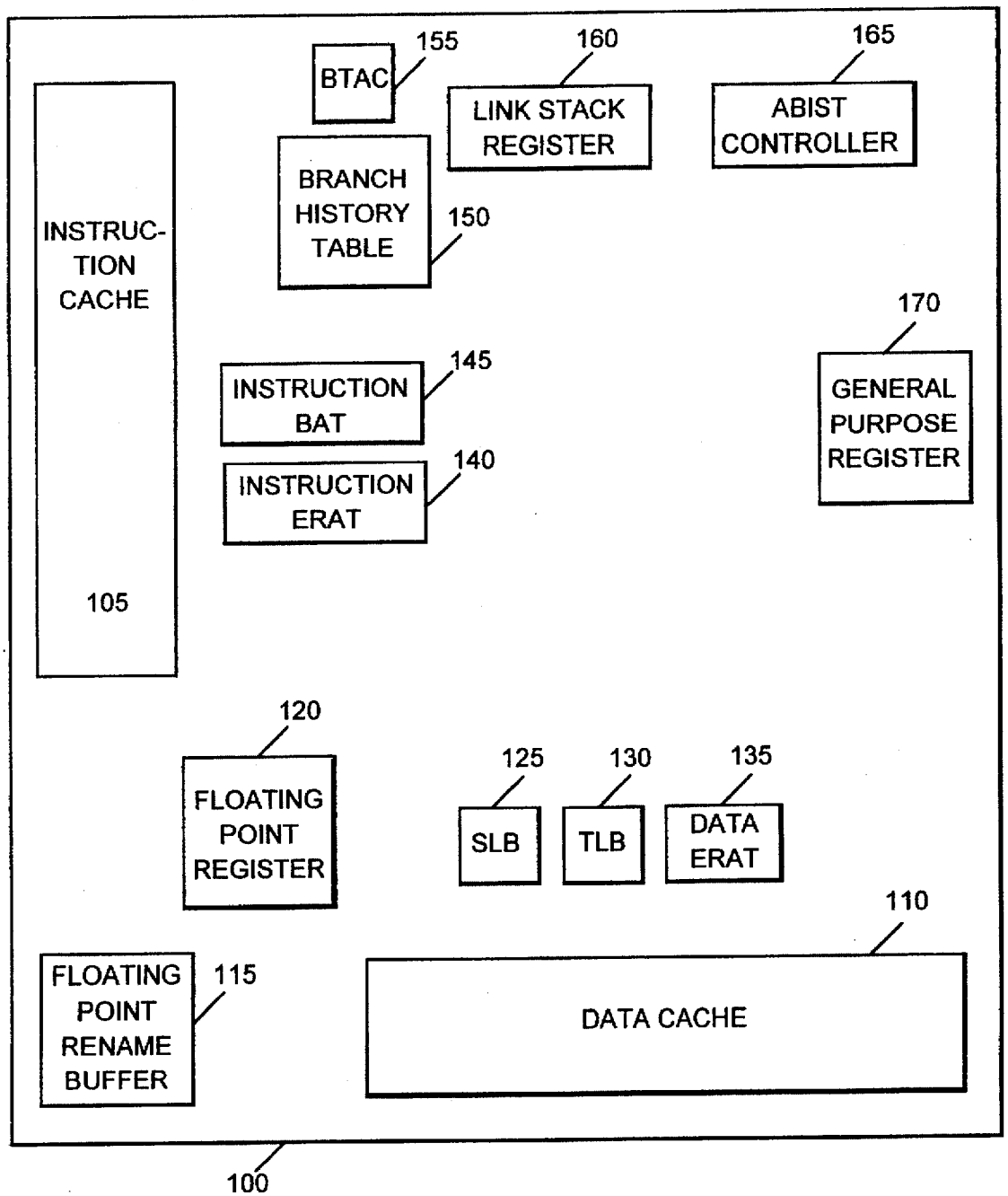
FIG. 1 is a block diagram of a processor architecture in accordance with the present invention.

FIG. 1 depicts a representative block diagram of the internal architecture of a large scale processor. Processor 100 contains, as an example, thirteen separate embedded arrays that are fault tested by ABIST controller 165. The two principal embedded arrays in processor 100 are instruction cache 105 and data cache 110. Associated with instruction cache 105 are instruction branch address translation (BAT) unit 145 and instruction effective-to-real address translation (ERAT) unit 140. Associated with data cache 110 is target look aside buffer (TLB) 130, segment look aside buffer (SLB) 125, and data effective-to-real address translation (BRAT) unit 135.

General purpose register 170 represents the typical bank of registers found in most microprocessors. In one embodiment of the present invention, general purpose register 170 represents 32 separate registers, each containing a 32 bit word. Processor 100 also contains branch history table (BHT) 150, used to store data concerning branch instructions contained in a specified line of instructions, and branch target address cache (BTAC) 155, used to store target addresses accessed by previous branch instructions. Other storage locations contained in processor 100 include floating point rename buffer 115, floating point register 120 and link stack register 160. Generally, instruction cache 105 and data cache 110 will be considerably larger in size than the other embedded arrays in processor 100.

As will be further discussed below, ABIST controller 165 provides serial test data vectors, serial test address vectors and serial control signals that are simultaneously scanned into test circuit shift registers disposed proximate the thirteen embedded arrays in processor 100. ABIST controller 165 causes multiple simultaneous read/write operations to be performed on the thirteen embedded arrays and performs a polynomial division on the test data vectors that are read from the embedded memory arrays in order to calculate a remainder. If the calculated remainder is the same as a unique signature remainder associated with the test data vectors used, the embedded arrays are functioning properly.

Figure 2:
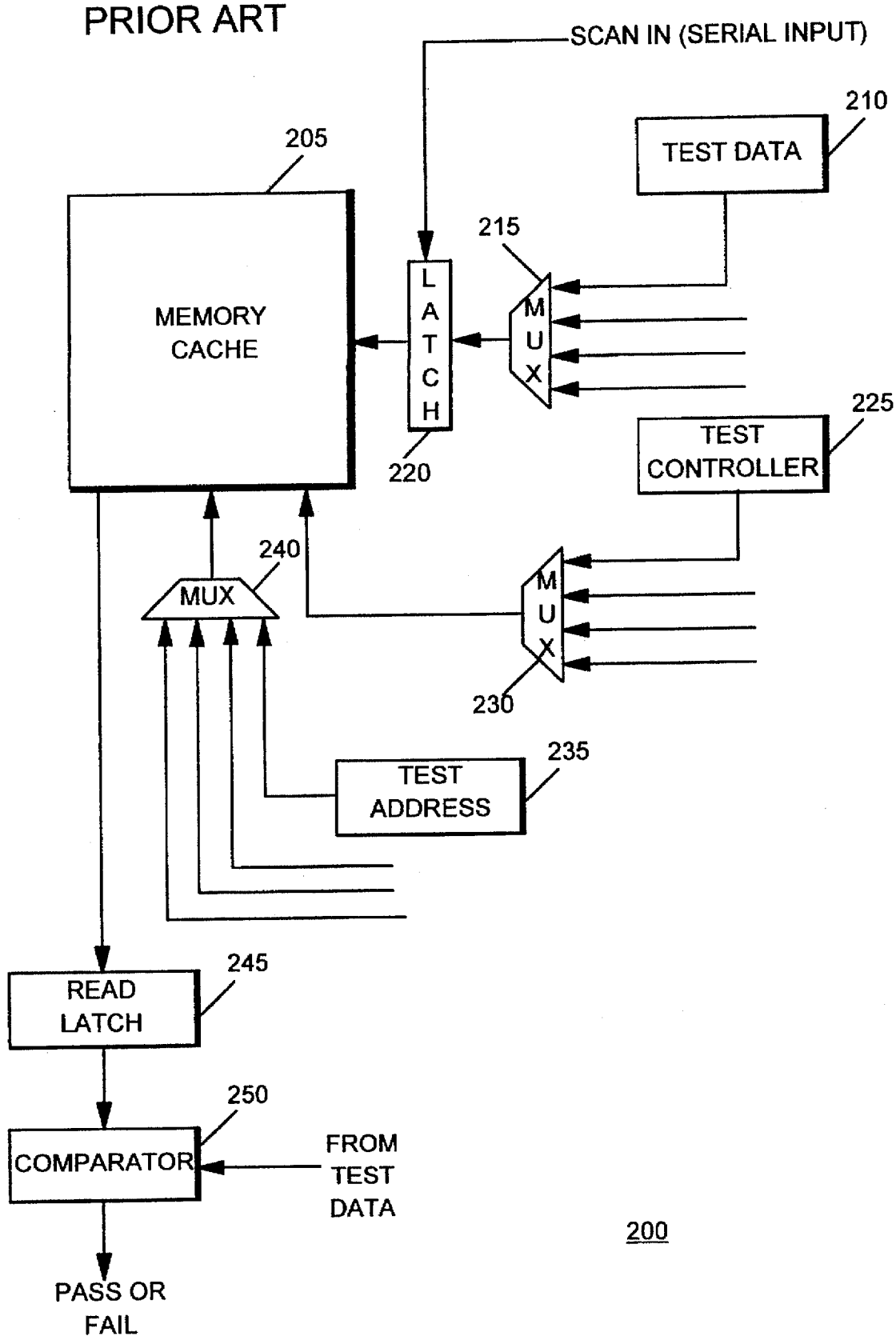
FIG. 2 is a schematic diagram of an embedded array test circuit in accordance with the prior art.

FIG. 2 depicts a prior art ABIST test circuit 200 used to fault check a single embedded array. Memory cache 205 is a generic representation of any of the specific embedded arrays illustrated in FIG. 1. Test data buffer 210 contains a plurality of N test data vectors that are selected through multiplexer 215 and stored into N locations of memory cache 205 by latch 220 during a self test mode of processor 100. Test address buffer 235 contains a state machine which generates a sequence of N address vectors that are selected through multiplexer 240 and applied to the address lines of memory cache 205 during self test mode. After memory cache 205 has been loaded with test data vectors, the test data vectors are read from memory cache 205 into read latch 245. Each test data vector read from memory cache 205 is then tested against the original test data vector in comparator 250 to determine a pass condition or a fail condition for each location in memory cache 205.

ABIST test circuit 200 in FIG. 2 is separately implemented for each individual embedded array shown in FIG. 1. Test controller 225 is a specific purpose machine designed to meet the specific size parameters of each memory cache 205 (i.e., address lines and data bits). The size of test data buffer 210 and test address buffer 235 and the functionality of test controller 225 are all tailored to meet the specific size of each separate embedded array in processor 100. As FIG. 2 illustrates, ABIST test circuit 200 requires a considerable amount of hardware to test memory cache 205. This hardware increases the complexity of processor 100 and consumes valuable space on the integrated circuit chip.

Figure 3:
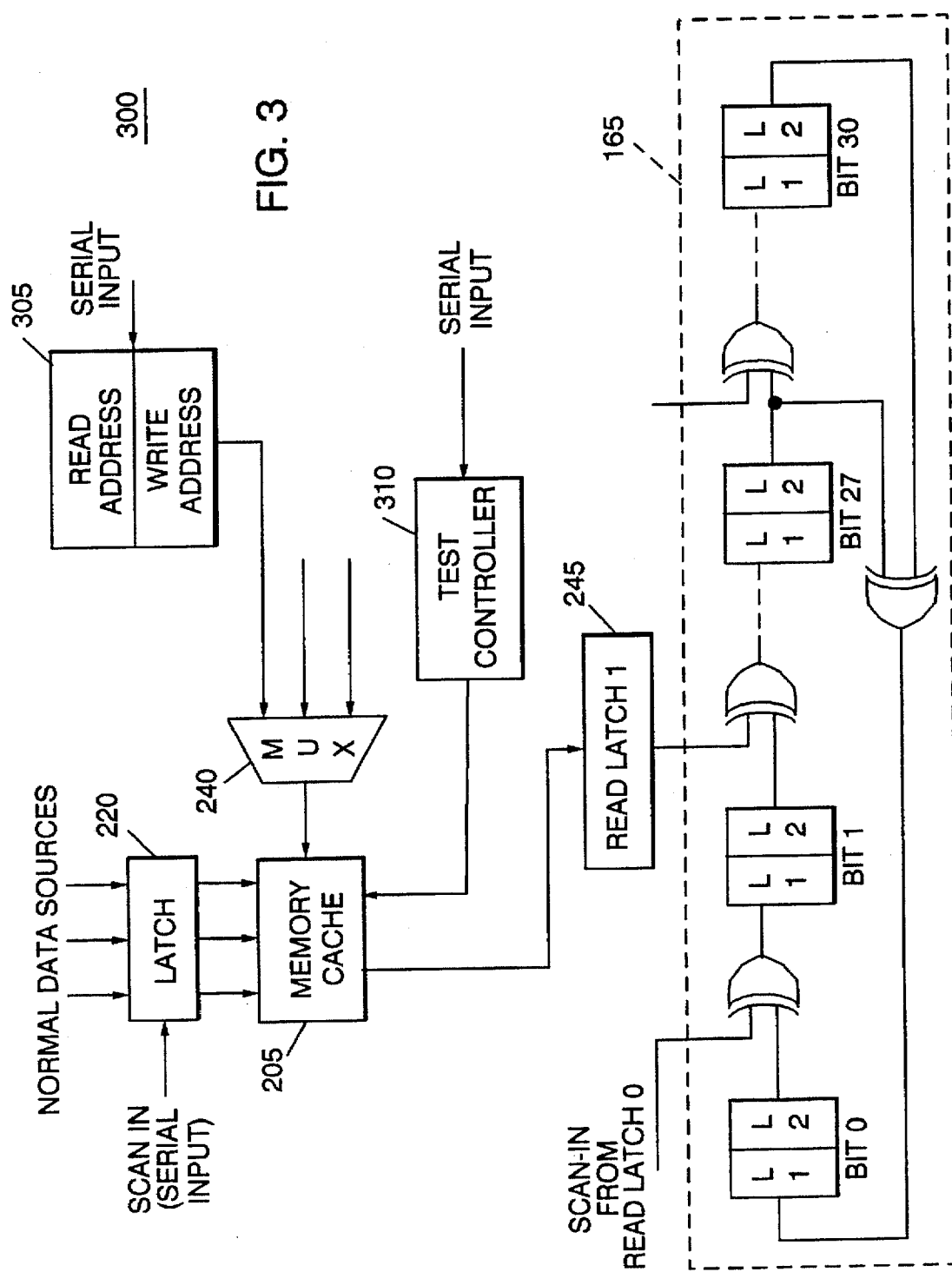
FIG. 3 is a schematic diagram of an embedded array test circuit in accordance with the present invention.

FIG. 3 depicts improved ABIST test circuit 300 in accordance with the present invention. Test data buffer 210 has been removed and test data vectors are scanned into latch 220 by ABIST controller 165 for subsequent storage in memory cache 205. Latch 220 is a serial input latch that is typically implemented in most processor architectures for the purpose of pipelining data. For a typical instruction or data cache, latch 220 is comprised of two 256 bit scan-in latches which are capable of simultaneously writing 16-32 bit words into memory cache 205.

Test address buffer 305 also receives a serial input that is scanned in from ABIST controller 165. Test address buffer 305 contains 2 addresses, a read address and a write address, that are used in an "at speed" test mode to write data into one address and then read data from a preceding or following address. In other test modes, the present invention may simply write test data vectors into all of the locations of memory cache 205 and then read back the test data vectors after a delay period.

As will be explained below in greater detail, test controller 310 comprises a group of latches that shift in a chain of address and control signals that implement the read and write operations. ABIST test circuitry 300 reads the test data vectors from memory cache 205 into read latch 245. All of the read latches of the embedded arrays are simultaneously scanned into a Multiple Input Shift Register (MISR) contained in ABIST controller 165 that is configured to perform a polynomial division. Each read latch 245 is serially shifted into a single stage, or channel, of the MISR. Each stage of the MISR performs an Exclusive-Or operation of the serially input data from the read latches with the output of the previous stage.

In a preferred embodiment of the present invention, the MISR circuit in ABIST controller 165 performs a polynomial division of the read latch data to obtain a 31 bit "signature" remainder that is unique for each set of test vectors stored in the embedded arrays of processor 100. The length of 31 bits in the MISR is selected for optimal polynomial division. In the illustrated embodiment in FIG. 1, there are only thirteen embedded array. The output of each of these arrays is serially shifted into one of the 31 bit stages in the MISR. The remaining 18 inputs to the bit stages are tied low. Bit 27 and bit 30 of the MISR are Exclusive-OR'ed together and the output is fed back to the input of the Bit 0 stage. The implementation of a polynomial division in a MISR to arrive at a unique signature remainder for a plurality of inputs is well-known in the art and need not be further explained here. The fundamentals of polynomial division are explained in PAUL H. BARDELL ET AL., BUILT-IN TEST FOR VLSI: PSEUDORANDOM TECHNIQUES 336, (New York, Wiley 1987), the teachings of which are hereby incorporated by reference into the present disclosure. The, polynomial division shown in FIG. 3 is an implementation of choice and it will be obvious to one skilled in the art that numerous other types of polynomial divisions may be implemented to fault check the operation of the embedded arrays in processor 100.

A key advantage to the present invention is that ABIST controller 165 can serially shift out the test address vectors and test data vectors to latch 220 and test address buffer 305 of all embedded arrays simultaneously. Likewise, ABIST controller 165 can simultaneously read back the test data vectors from read latch 245 of all the embedded arrays and then simultaneously serially shift all the read latch data into the MISR circuit in ABIST controller 165. Not all test data vector are the same length. As data is shifted out, binary zeroes are shifted into the test data vectors having less than 256 bits. Thus, the shorter test data vectors are padded on the left with leading zeroes.

Figure 4:
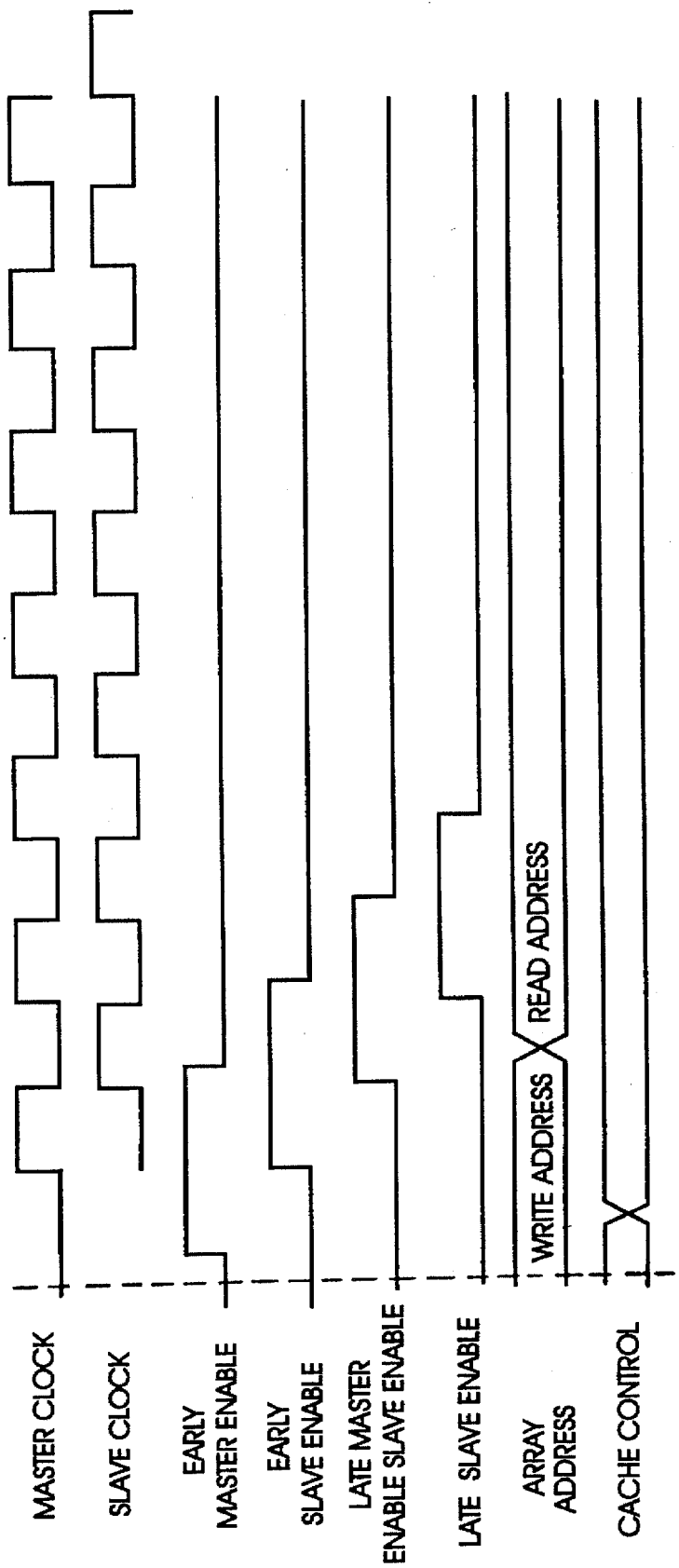
FIG. 4 is a timing diagram of address and control signals in accordance with the present invention.
Figure 5:
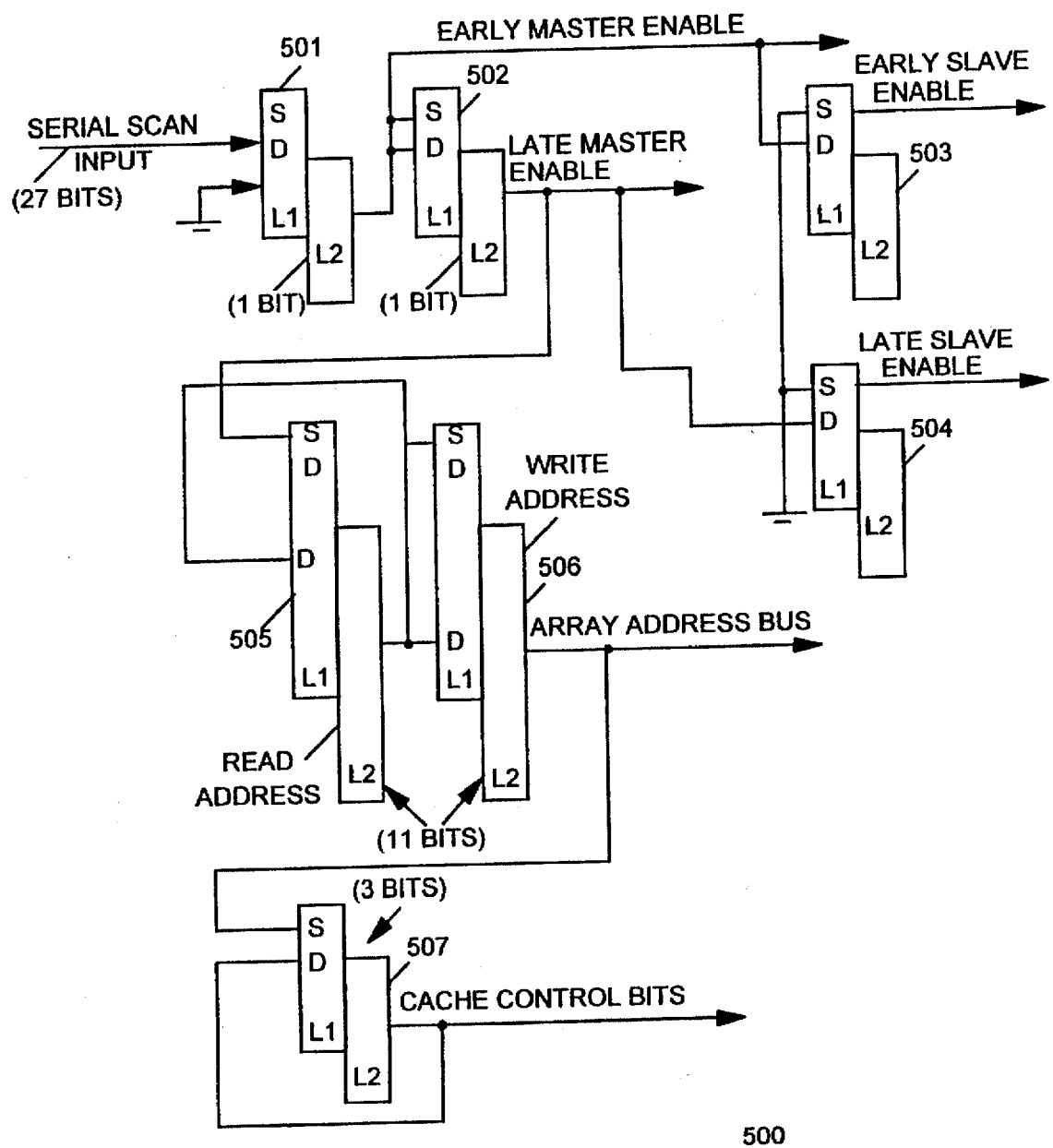
FIG. 5 is a schematic diagram of a latch configuration used to generate address and control signals in accordance with the present invention.

FIG. 4 shows a timing diagram of the address and control signals generated by latch configuration 500 shown in FIG. 5. Latch configuration 500 is part of test controller 310 and provides local signal distribution to each of the embedded arrays in processor 100. The address and control signals are generated by using the master clock and slave clock signals to scan 27 control and address bits into the serial scan input of latch configuration 500. The first 3 bits scanned in are the cache control bits, which are read out from latch 507. The write address, held in latch 506, and the read address, held in latch 505, each comprise 11 bits. Finally, the last 2 bits scanned into latches 501 and 502 are used to generate the signals Early Master Enable, Late Master Enable, Early Slave Enable and Late Slave Enable. The 27 bits scanned into the address and control latches in latch configuration 500 are timed to coincide with the last 27 bits of the test data vector scanned into latch 220 by ABIST controller 165.

The three cache control bits are used to determine the type of array test to be applied to memory cache 205 and are scanned to a given state and held constant. The L1 and L2 latches comprising latch configuration 500 are scannable master slave flip-flops with the D input used as the functional data input and the S input used for the scan input. The initial scan state of latch configuration 500 is such that the latches providing Late Master Enable, Early Slave Enable and Late Slave Enable are preset to zero and the latch providing Early Master Enable is preset to one. Once the functional clocks begin, the pipeline effect of the enable signals create all the required values of write enable. If the array address is pipelined in the interface to the array, one of the two late enables is used. Otherwise, the early enable signals are used. The read address in test address buffer 305 is pre-loaded with the value to be used in the array read operation and the write address in test address buffer 305 is pre-loaded with the write address. The pre-loading is required to perform an "at speed" write operation of a given location followed by a read operation of an adjacent location is vague.

As stated above, the serial input signals are simultaneously sent to all test controllers 310, test address buffers 305, and latches 220. Since some embedded arrays contain more memory locations than others, a smaller embedded arrays will be repeatedly tested during a single testing of a larger embedded array. For example, link stack register 160 may contain eight 32 bit locations and general purpose register 170 may contain thirty-two 32 bit locations. The eight locations in link stack register 160 are tested four times during a single testing of general purpose register 170. The smaller embedded arrays only utilize the least significant bits of the read address and the write address and therefor cycle through all locations several times during a single cycle through a larger array.

Figure 6:
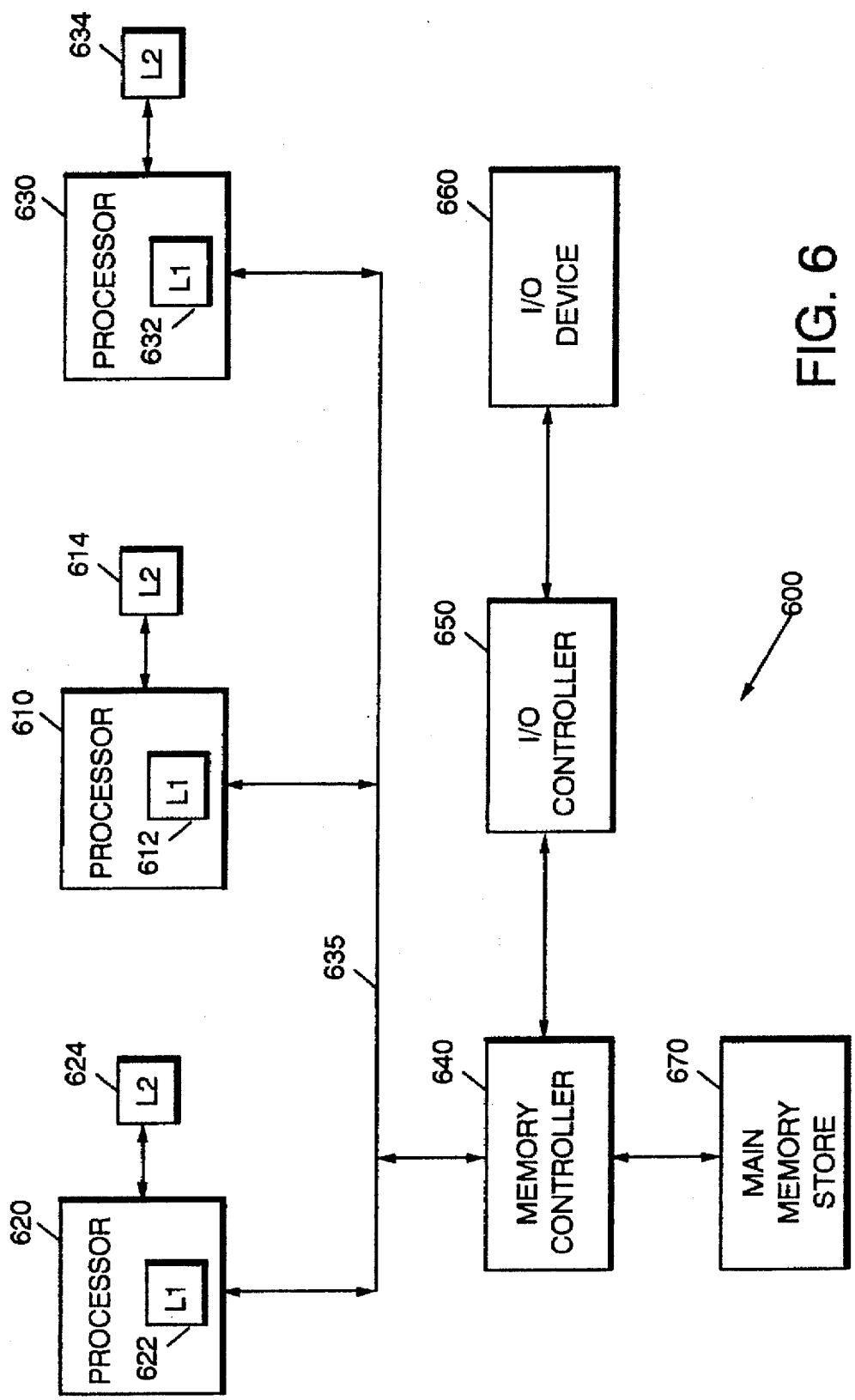
FIG. 6 illustrates a data processing system in accordance with the present invention.

Referring now to FIG. 6, a processing system is shown which advantageously embodies ABIST test circuits in accordance with the present invention. Multi-processor system 600 includes a number of processing units 610, 620 and 630 operatively connected to system bus 635. Note that any number of processing units may be utilized within multi-processor system 600. Also connected to system bus 635 is memory controller 640, which controls access to main memory store 670. Memory controller 640 is also coupled to I/O controller 650, which is coupled to I/O device 660. Processing units 610, 620 and 630, I/O controller 650, and I/O device 660 may all be referred to as bus devices herein. As shown, each processor unit 610, 620 and 630 may include a processor and L1 caches 612, 622 and 632, respectively. The L1 (primary) caches may be located on the same chip as the respective processor. Coupled to processing units 610, 620 and 630 are L2 (secondary) caches 614, 624 and 634, respectively. Each L2 cache is connected to the system bus 635 via the processor to which it is attached.

Each L1 and L2 cache pair are normally serially related. The L1 caches may be implemented as store-in or write-through, while the larger and slower L2 cache is implemented as a write-back cache. Both the L1 and L2 cache controllers are physically implemented as part of the processing unit, and are connected via buses internal to the processing unit. Alternatively, the L2 controller could be off-chip.

During routine operations, ABIST test circuits in accordance with the present invention will initiate self test within each processor unit upon power-up or whenever an external self-test command is received. The processor units may respond to internal failures by sending test failure indication signals to the external system. A faulty processor unit may then be taken off-line and processing tasks may be re-directed to other processor in processing system 600.

Although the present invention and its advantages have been described in detail, it should be understood that various changes, substitutions and alterations can be made herein without departing from the spirit and scope of the invention as defined by the appended claims.

What is claimed is:

1. An apparatus for testing a memory array comprising:
   a test data latch for receiving a test data vector on a serial input of said test data input latch and writing said test data vector in to a first location in said memory array;
   an address buffer for receiving a test address vector on a serial input of said address buffer and applying said test address vector to said memory array;
   an output latch for reading said test data vetor from said first location in said memory array; and
   control logic for 1) scanning said test data vector and said test address vector into said test data input latch and said address buffer, respectively, 2) generating a write signal operable to cause said test data vector to be written from said test data input latch into said first lacation in said memory array and 3) generating a read signal operable to cause said test data vector to be read from said first location in said memory array into said output latch.

2. The apparatus as set forth in claim 1, said control logic further comprising a shift register for receiving said test data vector from said output latch, using said test data vector as an input and performing a polynomial division on said input test data vector to generate a signature remainder indicating whether said first location contains a fault.

3. The apparatus as set forth in claim 1 wherein said control logic simultaneously scans said test data vector and said test address vector into said test data input latch and said address buffer, respectively.

4. The apparatus as set forth in claim 1 wherein said test address vector includes a first address in said memory array and a second address in said memory array adjacent to said first address and said control logic generates a write signal operable to cause a first test data vector to be written into said first address and generates a read signal operable to cause a second test data vector to be read from said second address immediately after said first data vector is written into said first address.

5. A processor comprising:
   N memory arrays;
   N test data input latches, each of said N test data input latches associated with a selected one of said N memory arrays, for receiving test data vectors on serial inputs of said N test data input latches and writing said test data vectors into a plurality of locations in said N memory arrays;
   N address buffers, each of said N address buffers associated with a selected one of said N memory arrays, for receiving test address vectors on serial inputs of said N address buffers and applying said test address vector to said N memory arrays;
   N output latches, each of said N output latches associated with a selected one of said N memory arrays, for reading said test data vectors from said plurality of locations in said N memory arrays; and
   control logic comprising:
      vector loading circuitry for scanning said test data vectors into said N test data input latches and scanning said test address vectors into said N address buffers;
      data write circuitry for generating a plurality of write signals operable to cause said test data vectors to be written from said N test data input latches into said plurality of locations in said N memory arrays;
      data read circuitry for generating a plurality of read signals operable to cause said test data vectors to be read from said plurality of locations in said N memory arrays into said N output latches.

6. The apparatus as set forth in claim 5, said control logic further comprising a multiple input shift register having at least N inputs for receiving said test data vectors from said N output latches, using said test data vectors as inputs and performing a polynomial division on said input test data vectors to generate a signature remainder indicating whether any of said plurality of locations in said N memory arrays contains a fault.

7. The apparatus as set forth in claim 6 wherein said control logic further comprises circuitry for 1) serially shifting said test data vectors from each of said N output latches into a selected one of said at least N inputs of said multiple input shift register, 2) causing said multiple input shift register to perform a polynomial division operation using said test data vectors, and 3) comparing a remainder calculated by said polynomial division operation with a signature remainder to determine if any of said plurality of locations in said N memory arrays contains a fault.

8. The apparatus as set forth in claim 5 wherein said vector loading circuitry simultaneously scans said test data vectors and said test address vectors into said N test data input latches and said N address buffers, respectively.

9. The apparatus as set forth in claim 5 wherein said test address vectors include a first address in each of said N memory arrays and a second address in each of said N memory array adjacent to said first address and said control logic generates a write signal operable to cause a first test data vector to be written into said first address and generates a read signal operable to cause a second test data vector to be read from said second address immediately after said first data vector is written into said first address.

10. A method of testing a memory array comprising the steps of:

serially shifting a test data vector into a test data input latch;

serially shifting a test address vector into an address buffer;

applying the test address vector in the address buffer to the address lines of the memory array;

writing the test data vector from the test data input latch into a first location in the memory array;

reading the test data vector from the first location in the memory array into an output latch;

serially shifting the test data vector from the output latch into a multiple input shift register; and performing a polynomial division operation using the shifted test data vector as an input to generate thereby a signature remainder indicating whether the first location in the memory array contains a fault.

11. The method as set forth in claim 10 wherein the test data vector and the test address vector are simultaneously serially shifted into the test data input latch and the address buffer.

* * * * *